(12) United States Patent
Kommrusch et al.

(10) Patent No.: US 8,884,668 B2
(45) Date of Patent: Nov. 11, 2014

(54) SAFE RESET CONFIGURATION OF FUSES AND FLOPS

(71) Applicant: Advanced Micro Devices, Inc., Sunnyvale, CA (US)

(72) Inventors: Steven J. Kommrusch, Fort Collins, CO (US); Bill K. C. Kwan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 13/857,085

(22) Filed: Apr. 4, 2013

(65) Prior Publication Data

US 2014/0300395 A1  Oct. 9, 2014

(51) Int. Cl.
 *H03L 7/00* (2006.01)
 *H03K 3/012* (2006.01)
(52) U.S. Cl.
 CPC ................................. *H03K 3/012* (2013.01)
 USPC ............................ 327/143; 327/142; 327/198
(58) Field of Classification Search
 USPC .............. 327/141–163, 198; 331/1/A, 15–17; 375/373–376
 See application file for complete search history.

(56) References Cited

U.S. PATENT DOCUMENTS

| 6,144,374 | A | * | 11/2000 | Hyun | 345/204 |
| 6,771,103 | B2 | * | 8/2004 | Watanabe et al. | 327/161 |
| 2004/0124898 | A1 | * | 7/2004 | Kodama | 327/198 |
| 2011/0304353 | A1 | * | 12/2011 | Lee et al. | 326/16 |
| 2012/0062283 | A1 | | 3/2012 | Kwan et al. | |
| 2013/0027104 | A1 | * | 1/2013 | Ohta et al. | 327/241 |

* cited by examiner

*Primary Examiner* — Brandon S Cole
(74) *Attorney, Agent, or Firm* — Williams Morgan, P.C.

(57) ABSTRACT

Methods, apparatus, and fabrication techniques relating to improved propagation of fuse data through an integrated circuit device during scan shift reset. In some embodiments, the methods comprise loading a first value of at least one fuse bit to an integrated circuit device, during a time period when a clock signal having a first frequency is provided to at least one component of the integrated circuit device; disabling a scan shift after the loading of the first value; inactivating the clock signal after the loading of the first value; propagating the first value of the at least one fuse bit to the at least one component of the integrated circuit device; and reactivating the clock signal after the propagation of the first value.

15 Claims, 5 Drawing Sheets

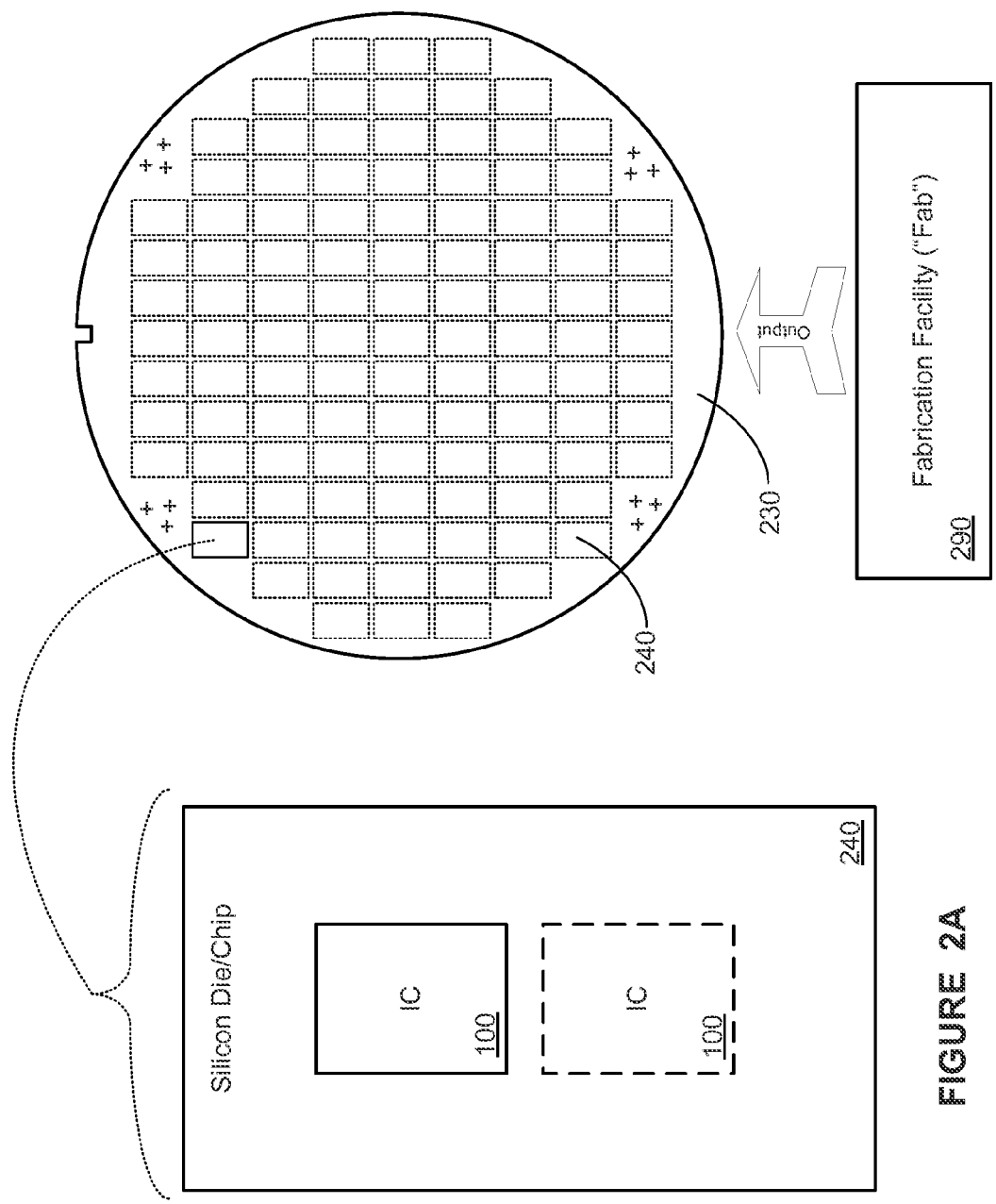

SAFE RESET CONFIGURATION OF FUSES AND FLOPS

BACKGROUND OF THE INVENTION

1. Technical Field

Generally, the present disclosure relates to integrated circuits, and, more particularly, to safe reset configuration of components thereof.

2. Description of the Related Art

Insuring reliable reset state for integrated circuits is highly desirable. Scan shift reset can be used to fully initialize all flip flops in a design, but often fuse bits must be read and applied for the full state to be preset. To apply fuse bits, some prior designs require fuse data to be delivered before scan shift reset completes, other prior designs use control logic and flops to distribute fuse data, and some still other prior designs use synchronizers to synchronize the asynchronous fuse signals into the destination domain.

Often, these prior attempts to read and apply fuse bits are technology/library/placement dependent and thus are hard to carry from one design to another. For example, the synchronizer method must be carefully analyzed for each design targeted for different technology, because the synchronizer library cell design can be different and thus the metastability characteristic is also different. The end result is variations in the failure rates in different design. The actual design might need to be adjusted to provide enough guard band, based on calculated failure rates.

There remains a need for fuse data to be safely distributed without a need for pipeline flops.

SUMMARY OF EMBODIMENTS OF THE INVENTION

The apparatuses, systems, and methods in accordance with some embodiments of the present disclosure may safely distribute fuse data throughout a large integrated circuit without pipeline flops being needed. This may save design complexity and power consumption during operation of the integrated circuit.

An apparatus in accordance with some embodiments of the present disclosure includes: at least one component; a clock capable of operating at a first frequency and providing a clock signal to the at least one component; and a processor configured to: load the first value of at least one fuse bit, during a time period when the clock signal having a first frequency is provided to the at least one component; disable a scan shift after the loading of the first value; inactivate the clock signal after the loading of the first value; propagate the first value of the at least one fuse bit to the at least one component; and reactivate the clock signal after the propagation of the first value.

A method in accordance with some embodiments of the present disclosure comprises: loading a first value of at least one fuse bit to an integrated circuit device, during a time period when a clock signal having a first frequency is provided to at least one component of the integrated circuit device; disabling a scan shift after the loading of the first value; inactivating the clock signal after the loading of the first value; propagating the first value of the at least one fuse bit to the at least one component of the integrated circuit device; and reactivating the clock signal after the propagation of the first value.

Some embodiments of the disclosure may be used in any type of integrated circuit that uses multiple compute units, a shared cache unit, and a power management unit. One example is a general purpose microprocessor.

BRIEF DESCRIPTION OF THE FIGURES

The disclosed subject matter will hereafter be described with reference to the accompanying drawings, wherein like reference numerals denote like elements, and:

FIG. 2A provides a representation of a silicon die/chip that includes one or more circuits as shown in FIG. 1, in accordance with some embodiments of the disclosure.

FIG. 2B provides a representation of a silicon wafer which includes one or more dies/chips that may be produced in a fabrication facility, in accordance with some embodiments of the disclosure.

Figure 1:
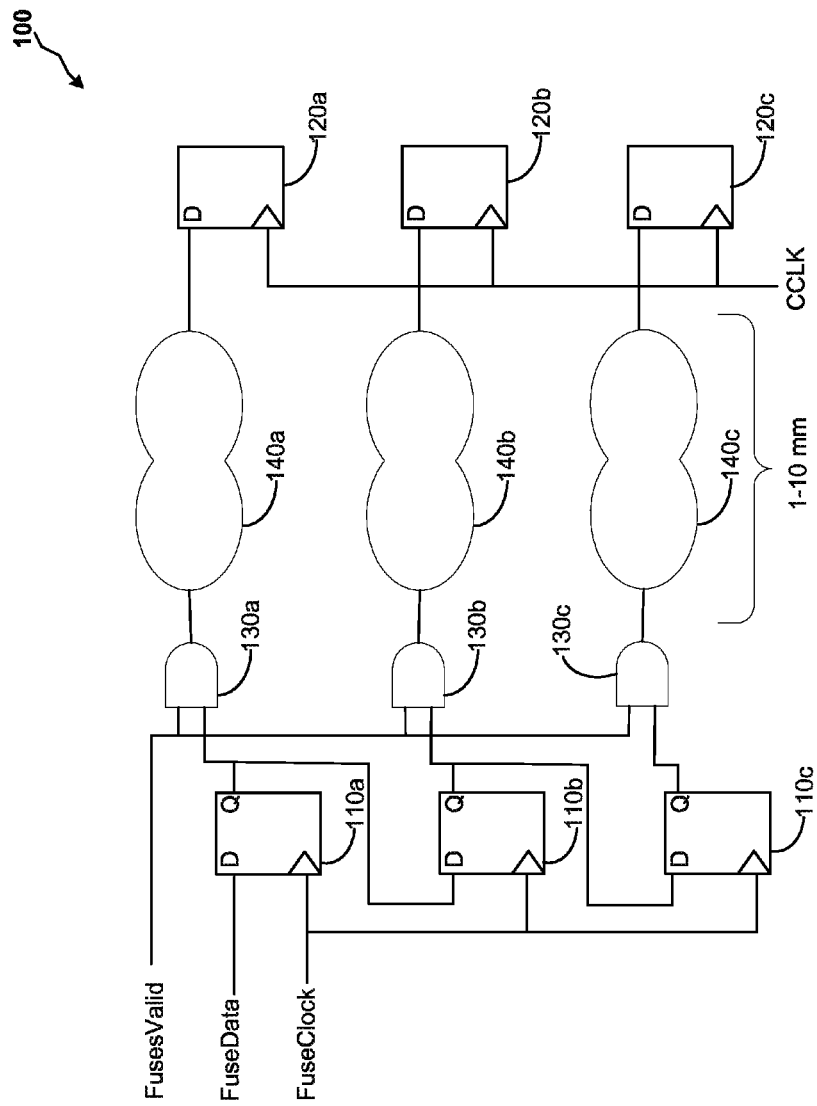
FIG. 1 is a simplified schematic diagram of a portion of an integrated circuit comprising flops, in accordance with some embodiments of the disclosure.

While the disclosed subject matter is susceptible to various modifications and alternative forms, some embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

Some embodiments of the present disclosure provide for apparatuses, systems, and methods that may distribute fuse data without a need for pipeline flops. Savings in resource usage and power consumption may be realized by implementing embodiments disclosed herein, thereby improving performance of an integrated circuit device and apparatuses comprising the integrated circuit device.

Turning now to FIG. 1, a block diagram, a stylized representation of components of an integrated circuit 100, in accordance with some embodiments of the present disclosure, is illustrated. Components of the integrated circuit 100 include, but are not limited to, at least one flop 110 (such as flops 110a, 110b, and 110c) and at least one additional component, e.g. at least one flop 120 (such as flops 120a, 120b, and 120c). A flop 110 and a flop 120 may be widely separated on the integrated circuit, such as 1-10 mm apart.

Data from FuseData may be clocked in on an appropriate edge of FuseClock at flop 110a, and then pass on to flops 110b and 110c on subsequent cycles of FuseClock. Fuse data may also pass from flop 110a to AND gate 130a. If FusesValid is true, then on subsequent clock cycles, the fuse data may pass from AND gate 130a through one or more logic elements (collectively, 140a). Comparable data flow takes place from flops 110b and 110c. It should be noted that logic elements 140b and/or 140c may differ from 140a and/or each other.

The flops 120a, 120b, and 120c receive a clock signal CCLK. CCLK may be generated by a clock generator, such as one operating on a clock signal (which may be termed "PLLCLK") generated by a phase-locked loop (PLL, not shown). If CCLK is active, then when fuse data is output from the final logic element of logic elements 140a, 140b, or 140c, the fuse data is clocked in to flops 120a, 120b, or 120c, respectively on an appropriate edge of CCLK. However, starting from the staggered output of fuse data from fuses flops 110a, 110b, and 110c, and combined with any differences between logic elements 140a, 140b, and 140c, the fuse data would often be clocked into flop 120a at a different time than it is clocked into flop 120b and/or flop 120c. This is undesirable.

However, the undesirable situation generally only arises if CCLK is active. If CCLK is inactive as fuse data propagates from 110a through 140a, 110b through 140b, and 110c through 140c, then the fuse data would only be clocked into flops 120a, 120b, and 120c at the appropriate edge of the first clock cycle upon reactivation of CCLK. Thus, the fuse data would be clocked into each flop 120a, 120b, and 120c at the same time.

Turning now to FIG. 2A, in some embodiments, the integrated circuit 100 may reside on a silicon die/chip 240. The silicon die/chip 240 may be housed on a motherboard or other structure of a computer system. In one or more embodiments, there may be more than one integrated circuit 100 on each silicon die/chip 240. Various embodiments of the integrated circuit 100 may be used in a wide variety of electronic devices.

Turning now to FIG. 2B, in accordance with some embodiments, and as described above, the integrated circuit 100 may be included on the silicon chip/die 240. The silicon chip/die 240 may contain one or more different configurations of the integrated circuit 100. The silicon chip/die 240 may be produced on a silicon wafer 230 in a fabrication facility (or "fab") 290. That is, the silicon wafer 230 and the silicon die/chip 240 may be referred to as the output, or product of, the fab 290. The silicon chip/die 240 may be used in electronic devices.

The circuits described herein may be formed on a semiconductor material by any known means in the art. Forming can be done, for example, by growing or deposition, or by any other means known in the art. Different kinds of hardware descriptive languages (HDL) may be used in the process of designing and manufacturing the microcircuit devices. Examples include VHDL and Verilog/Verilog-XL. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in one embodiment, may be used to configure a manufacturing facility (e.g., through the use of mask works) to create devices capable of embodying various aspects of the instant disclosure. As understood by one or ordinary skill in the art, it may be programmed into a computer, processor, or controller, which may then control, in whole or part, the operation of a semiconductor manufacturing facility (or fab) to create semiconductor products and devices. These tools may be used to construct the embodiments of the disclosure described herein.

In general, fuse data may be loaded in parallel with scan shift reset, and timing artifacts of the scan shift sequence may be used to safely distribute fuse data throughout a large integrated circuit without pipeline flops being needed. The clock serving components of the integrated circuit may be momentarily inactivated for the transition of the SSE (scan shift enable) and the propagation of fuse data. The propagation may also take place upon occurrence of some condition where the clock stops during reset but after fuse data load. For example, if there was a time after fuse data loads when a PLL is locking, fuse data could then be propagated.

Whatever the cause of the inactive period of the clock, fuse data can be safely buffered through a complex integrated circuit without need for pipelining flops, by having the fuse values only change state when the clock is already held inactive. Upon completion of propagation, the clock may be reactivated.

Figure 3A:
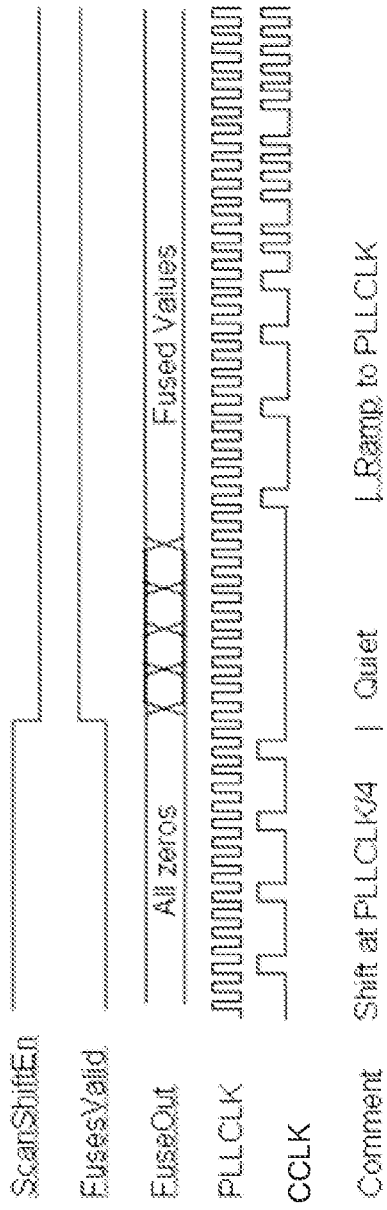
FIG. 3A is a waveform diagram of various clock signals, in accordance with some embodiments of the disclosure.
Figure 3B:
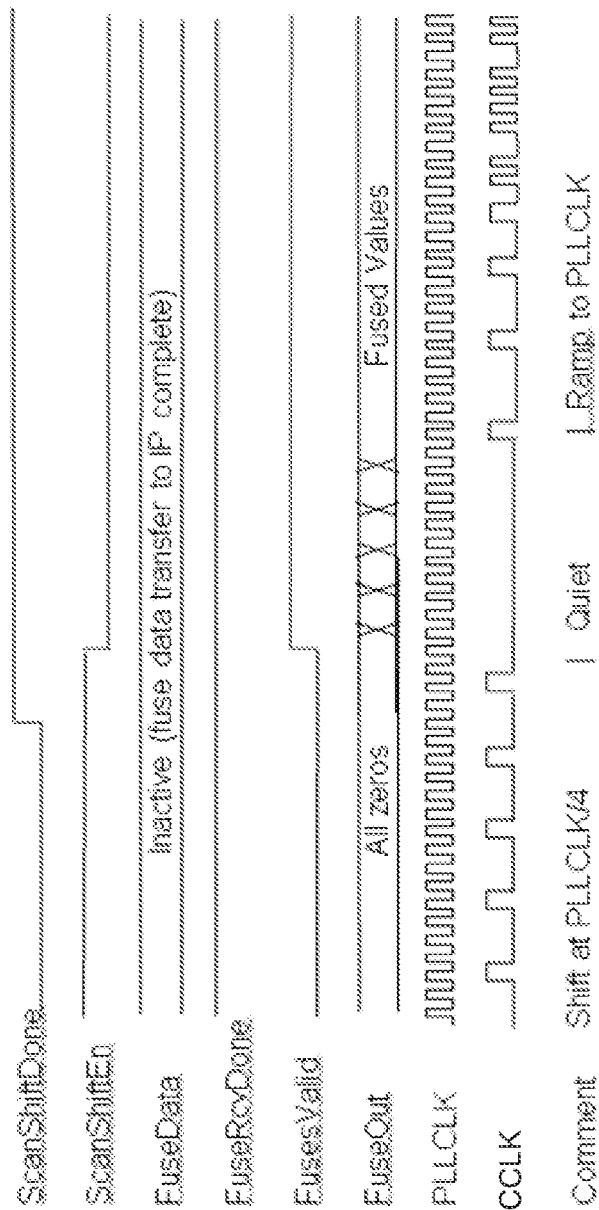
FIG. 3B is a waveform diagram of various clock signals, in accordance with some embodiments of the disclosure.
Figure 3C:
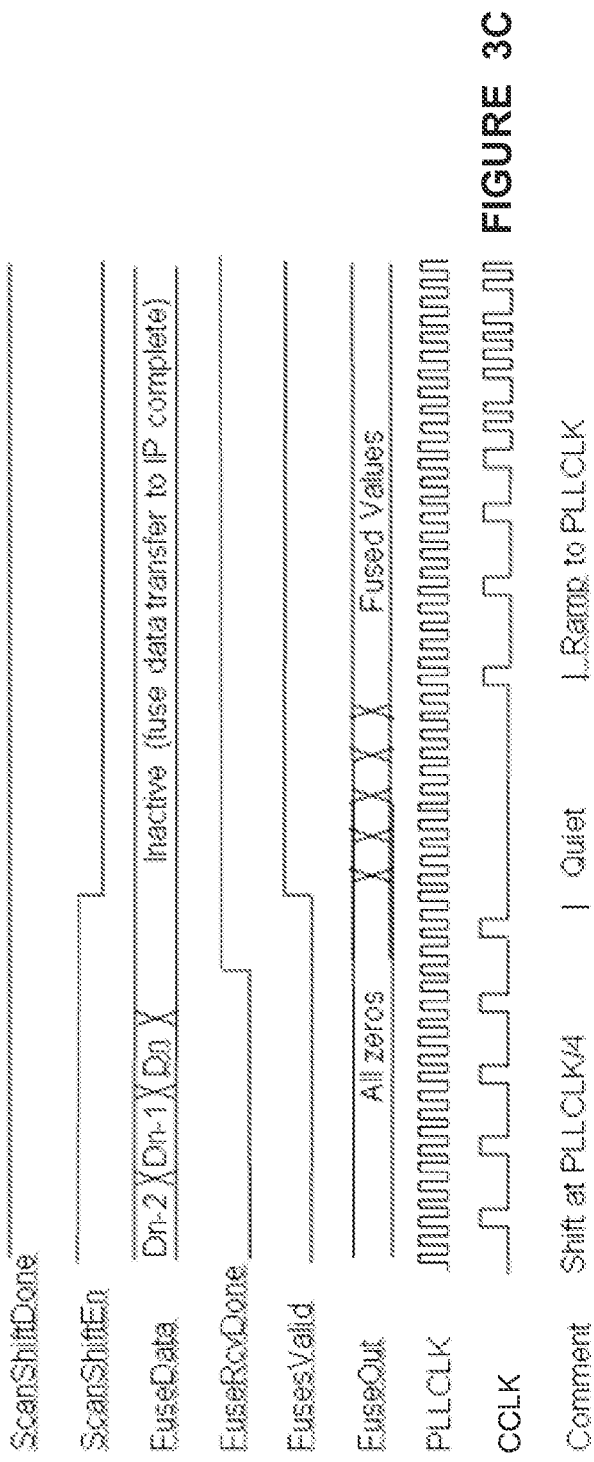
FIG. 3C is a waveform diagram of various clock signals, in accordance with some embodiments of the disclosure.

FIGS. 3A-3C provide waveform diagrams for various situations, in accordance with some embodiments.

FIG. 3A shows the key signals that change which allow the fuse data to propagate to their destination during a time when the clock will be turned off. This propagation avoids the need for pipelining fuse data to its destination from the receiver.

In FIG. 3A, the shift operations of a scan shift are performed with a clock frequency (CCLK) of PLLCLK/4. Then CCLK enters a quiet state. When a ScanShiftEn(able) signal is deasserted, a FusesValid signal may be asserted at the same time. In response, a FuseOut signal propagates fuse data from fuses to additional components, until fused values have been fully propagated. CCLK may then be reactivated, such as by ramping it to frequency PLLCLK.

FIG. 3B shows adds details for the normal case where fuse data is complete before the scan shift reset sequence completes. Specifically, it shows CCLK entering the quiet state subsequent a monitoring circuit reporting completion of the scan shift (ScanShiftDone is asserted).

FIG. 3C shows details for the case where the fuse data is still being sent when scan shift is complete. Three last beats of fuse data arrive at the fuses and the scan shift is continued (ScanShiftEn remains asserted) until the fuse data receive is done. The FuseOut signal is held low until the FusesValid signal goes high, simultaneously with ScanShiftEn falling and not before deactivation of CCLK.

Figure 4:
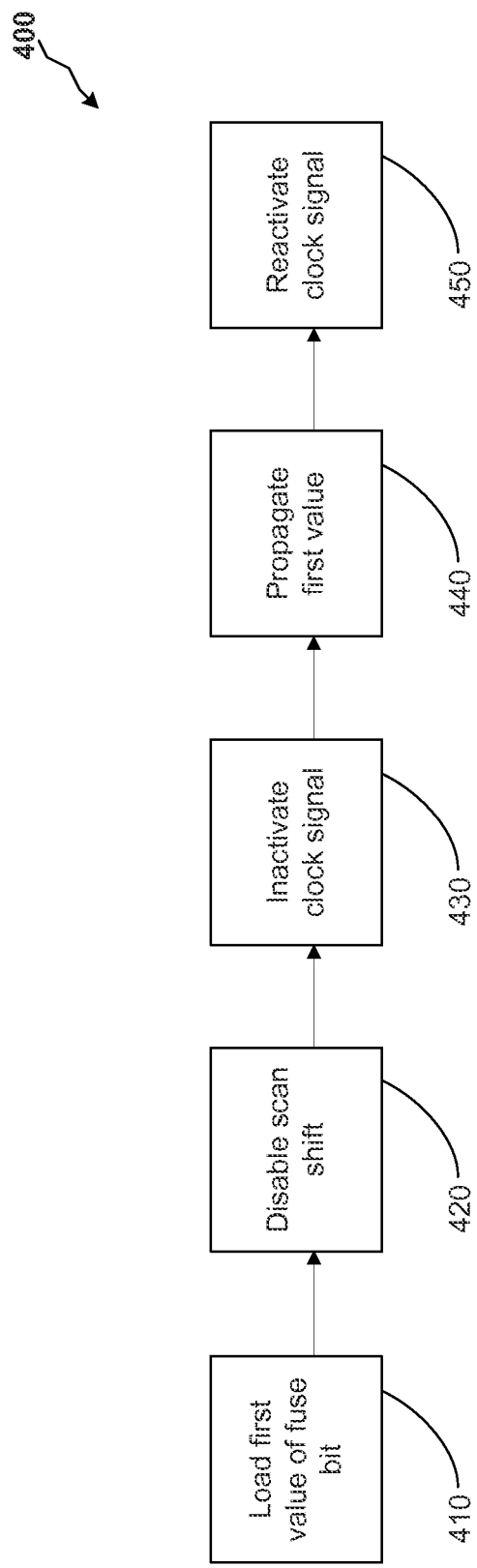
FIG. 4 is a flowchart of a method relating to propagating fuse data, in accordance with some embodiments of the disclosure.

FIG. 4 presents a flowchart depicting a method 400 according to some embodiments of the present disclosure. The method 400 may comprise: loading at 410 a first value from at least one fuse bit to an integrated circuit device, during a time period when a clock signal having a first frequency is provided to at least one component of the integrated circuit device. In some embodiments, loading at 410 is performed when the integrated circuit device is undergoing a power transition, e.g., upon boot up, during a reset operation, etc. After the loading at 410, the method 400 may also comprise disabling at 420 a scan shift and inactivating at 430 the clock signal.

Should the scan shift be complete prior to full loading at 410 of the first value, the disabling at 420 may be delayed until the loading at 410 of the first value is complete.

With scan shift disabled and the clock signal inactive, the method 400 may also comprise propagating at 440 the first value of the at least one fuse bit to the at least one component of the integrated circuit device. After the propagating at 440, the method 400 may also comprise reactivating at 450 the clock signal.

Upon reactivation at 450, the clock signal may have a second frequency. In some embodiments, such as those exemplified in FIGS. 3A-3C, the first frequency and the second frequency may be different. Employing some embodiments disclosed herein, a relatively safe avenue is provided for distributing fuse data without necessarily a need for pipeline flops. Savings in resource usage and power consumption may be realized by implementing embodiments disclosed herein.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

What is claimed is:

1. A method, comprising:
   loading a first value to at least one fuse bit of an integrated circuit device, during a time period when a clock signal having a first frequency is provided to at least one component of the integrated circuit device;
   disabling a scan shift after the loading of the first value;
   inactivating the clock signal after the loading of the first value;
   propagating the first value from the at least one fuse bit to the at least one component of the integrated circuit device; and
   reactivating the clock signal after the propagation of the first value, wherein the clock signal has a second frequency after the propagation of the first value.

2. The method of claim 1, wherein the first frequency and the second frequency are different.

3. The method of claim 1, wherein the scan shift is complete prior to the loading of the first value, and the disabling of the scan shift is delayed until the loading of the first value is complete.

4. The method of claim 1, wherein the loading is performed in response to a signal to reset the integrated circuit device.

5. The method of claim 1, wherein the inactivating the clock is performed when a phase-locked loop (PLL) is locking.

6. An apparatus, comprising:
   at least one fuse bit capable of having a first value loaded thereto;
   at least one additional component;
   a clock capable of operating at a first frequency and providing a clock signal to the at least one additional component; and
   a processor configured to:
      load the first value to the at least one fuse bit, during a time period when the clock signal having a first frequency is provided to the at least one component;
      disable a scan shift after the loading of the first value;
      inactivate the clock signal after the loading of the first value;
      propagate the first value from the at least one fuse bit to the at least one component of the integrated circuit device; and
      reactivate the clock signal after the propagation of the first value,
   wherein the clock is further capable of operating at a second frequency, and the clock signal has a second frequency after the propagation of the first value.

7. The apparatus of claim 6, wherein the first frequency and the second frequency are different.

8. The apparatus of claim 6, wherein the processor is configured to delay disabling of the scan shift until the loading of the first value is complete.

9. The apparatus of claim 6, wherein the processor is configured to load in response to a signal to reset the integrated circuit device.

10. The apparatus of claim 6, further comprising a phase-locked loop (PLL), and wherein the processor is configured to inactivate the clock is performed when the PLL is locking.

11. A non-transitory computer readable storage medium encoded with data that, when implemented in a manufacturing facility, adapts the manufacturing facility to create an apparatus, comprising:
    at least one fuse bit capable of having a first value loaded thereto;
    at least one additional component;
    a clock capable of operating at a first frequency and providing a clock signal to the at least one additional component; and
    a processor configured to:
       load the first value to the at least one fuse bit, during a time period when the clock signal having a first frequency is provided to the at least one component;
       disable a scan shift after the loading of the first value;
       inactivate the clock signal after the loading of the first value;
       propagate the first value from the at least one fuse bit to the at least one component of the integrated circuit device; and
       reactivate the clock signal after the propagation of the first value,
    wherein the clock is further capable of operating at a second frequency, and the clock signal has a second frequency after the propagation of the first value.

12. The non-transitory computer readable storage medium of claim 11, wherein the first frequency and the second frequency are different.

13. The non-transitory computer readable storage medium of claim 11, wherein the processor is configured to delay disabling of the scan shift until the loading of the first value is complete.

14. The non-transitory computer readable storage medium of claim 11, wherein the processor is configured to load in response to a signal to reset the integrated circuit device.

15. The non-transitory computer readable storage medium of claim 11, further comprising a phase-locked loop (PLL), and wherein the processor is configured to inactivate the clock is performed when the PLL is locking.

* * * * *